United States Patent [19]

Garza et al.

[11] Patent Number: 5,085,729
[45] Date of Patent: Feb. 4, 1992

[54] UNIFORMITY USING STAGNANT SILYLATION

[75] Inventors: Cesar M. Garza, Plano; Ricky A. Jackson, Garland; Ryan E. Priebe, Dallas, all of Tex.

[73] Assignee: Texas Instruments Incorporated, Dallas, Tex.

[21] Appl. No.: 579,120

[22] Filed: Sep. 7, 1990

[51] Int. Cl.$^5$ .................. H01L 21/306; B44C 1/22; B05D 3/06; G03C 5/00
[52] U.S. Cl. .................. 156/628; 156/643; 156/659.1; 156/904; 118/728; 427/43.1; 430/323
[58] Field of Search .......... 156/659.1, 661.1, 628, 156/904, 345, 643; 427/43.1, 399; 430/296, 298, 313, 322, 323; 118/715, 724, 728, 733

[56] References Cited

U.S. PATENT DOCUMENTS 4,751,170 6/1988 Mimura et al. ............. 156/628 X
4,867,838 9/1989 Brooks et al. ............. 156/904 X Primary Examiner—William A. Powell
Attorney, Agent, or Firm—Robby T. Holland; René E. Grossman; Richard L. Donaldson

[57] ABSTRACT

A system and method whereby the uniformity of the silylating agent throughout the reaction chamber and primarily at the surface of the wafer is significantly improved to provide a significant improvement in the line width uniformity. In accordance with a first embodiment of the invention, this is accomplished by stagnant silylation wherein the silylating agent is introduced into the reaction chamber and the reaction chamber is then sealed during the entire time required to carry out the silylation. The advantage of this approach is optimum uniformity since once equilibrium has been reached, there is no net change of flow or pressure of the silylating agent across the wafer. Another advantage is reduction in the total consumption of the silylating and carrier gases. In accordance with a second embodiment of the invention, the silylating agent flows laminarly across the surface of the wafer to provide uniformity of the silylating agent at the wafer surface. This is accomplished by introducing the silylating agent and carrier gas along one side of the wafer and uniformly flowing the gases across the entire wafer due to a pressure differential across the wafer from the location(s) of gas entry into the reaction chamber to the location(s) of gas exit from the reaction chamber, for example.

20 Claims, 2 Drawing Sheets

UNIFORMITY USING STAGNANT SILYLATION

CROSS REFERENCE TO RELATED APPLICATIONS

This application is related to Ser. No. 07/578,999 filed Sept. 7, 1990, the contents of which are incorporated herein by reference.

BACKGROUND OF THE INVENTION

1. Field of the Invention

This invention relates to a reaction chamber and method of silylation in conjunction with the fabrication of semiconductor devices.

2. Brief Description of the Prior Art

In the planar fabrication of semiconductor devices on a semiconductor wafer, a necessary step in the fabrication procedure requires printing of a pattern layer on the wafer surface, this printing step generally being repeated several times during the fabrication procedure. The patterns are generally printed on a resist layer. Resist layers are generally spun onto the surface of the semiconductor wafer under fabrication and are then exposed to light with either the exposed or unexposed portion of the resist then being removed and fabrication operations then taking place in the region from which the resist has been removed.

In order to fabricate such semiconductor devices in the minimum possible area and with accuracy, it is necessary that such patterns be printed on the semiconductor wafer under fabrication using the smallest possible pattern dimensions (i.e., high resolution) and that the patterns from layer to layer be placed within a predetermined maximum spatial tolerance of each other. This spatial tolerance is referred to as alignment.

The resolution of optical microlithography is being extended through the continued refinement of the photoresist process and exposure tools. Other evolutionary processes, such as surface-imaging, are also beginning to play a role in extending the practical resolution limit of optical microlithography.

One such surface imaging process is known as the DESIRE process. The DESIRE process, which is a surface imaging process where the features are developed in an anisotropic oxygen plasma, can extend the practical resolution limit of optical microlithography. The DESIRE process differs from conventional lithography mainly in two steps, these being (1) silylation and (2) dry development. The DESIRE process is set forth in an article by B. Coopmans and B. Roland entitled "DESIRE: a novel dry-developed resist system", *SPIE*, Vol. 631, an article by Cesar Garza et al. entitled "Mechanism of the DESIRE Process", *SPIE*, Vol. 771, Advances in Resist Technology IV (1987), pages 69 to 76, an article by Cesar Garza et al. entitled "Preliminary Performance Characterization of the DESIRE Process", *SPIE*, Vol. 920, Advances in Resist Technology and Processing V (1988), pages 233-240 and an article entitled "Manufacturability Issues of the DESIRE Process" *SPIE*, Vol. 1086, Advances in Resist Technology and Processing VI (1989), pages 229 to 237, the contents of each of which are incorporated herein by reference.

In the DESIRE process, silicon is selectively incorporated from the gas phase into the exposed areas of the photoresist, the photoresist being a standard prior art photoresist, such as, for example, diazoquinone and a dye wherein the exposed regions are converted into an acid, after coating and exposure of the photoresist. The dye prevents the light impinginq upon the
n photoresist from travelling entirely therethrough and limits such exposure to only a small depth at the surface of the photoresist. This provides several advantages over the art prior to the DESIRE process, these including the fact that (1) the side walls of the exposed region of the photoresist tend to move away from the vertical with increased depth and affects pattern quality and accuracy and (2) light reflected from neighboring substrates features can have an adverse impact in the dimensions and quality of the resist features, whereas it will not be a problem in the case of the DESIRE process. Accordingly, operation on the photoresist in the DESIRE process must now be concerned only with the surface regions thereof. The selective silylation results in a dramatic decrease in etch rate of the exposed areas in an anisotropic oxygen plasma. In the DESIRE process flow, one single layer of PLASMASK resist, which is a novolac resin having phenolic groups which are available for reaction plus a dy and a sensitizer is spincoated onto the substrate being fabricated and pre-baked to a self-planarizing layer. Typical resist thickness ranges from 1.5 to 2.5 microns depending upon the substrate. Prebake is carried out on a hot plate at temperatures of 90 to 110 degrees C. for 30 to 60 seconds, depending upon the resist thickness. After patternwise exposure on standard exposure equipment, the wafers are treated with a vaporized silylating agent (e.g. HMDS), such silylating agents being well known in the art This silylation is carried out at elevated temperature in the 150° to 180° range with a preferred temperature of 160°. As a result of the photochemical modifications of the resist during exposure, the exposed areas are selectively silylated in such a way that silicon is incorporated into the top 100 to 250 nanometers of these exposed parts. The incorporated silicon is chemically bound to the resin so that the silylated wafers remain stable for an extended period after silylation. The wafers are then developed in an oxygen plasma. During this plasma treatment, the silicon is converted into silicon dioxide which forms a thin protective mask that stops etching in the exposed areas. The unexposed parts do not contain silicon and are removed during the development or etching step. Extremely vertical resist profiles are obtained when an anisotropic plasma is used for the dry development.

In the silylation step, a suitable silicon containing chemical, such as hexamethyldizilazane (HMDS) reacts with the available hydroxyl or phenyl groups of the novolak resin component of the photoresist.

The most common procedure for carrying out silylation is to bubble an inert gas, such as nitrogen, through a vessel containing HMDS or other suitable silylating agent, to a reaction chamber. In such a reaction chamber, the wafer is located on a hot plate at a temperature suitable for this process.

The silylation process includes (1) a pre-silylation bake to increase the silylation contrast by thermally cross-linking the photoresist and (2) the silylation step itself, where the photoresist reacts with the silylating agent from the gas phase. An optimized process typically consists of a pre-silylation (also known as a post-exposure bake) at about 160 degrees C. for about two minutes followed by a silylation period of about four minutes at the same temperature as the post-exposure bake. This implies that the typical processing time is six minutes plus overhead, which is the time required to transport the wafer in and out of the chamber, plus the time required for the equipment circuitry to activate the proper set of valves or a throughput of up to about ten wafers per hour with present day equipment. It is currently the belief in the art that it is a requirement that the silylation bake be performed under the exact temperature conditions as the silylation step to control the process in a manufacturing environment.

It has been determined that in prior art reaction chambers utilized in conjunction with the DESIRE process, particularly in the near half micron photolithography area, dimensions are sensitive to changes in flow rate of the silylating agent across the wafer. In presently available equipment, such as Plasmaster-Si marketed by JSR, a consistent improvement in the line-width uniformity has been noted by changing the pattern and diameter o holes that allow the diffusion of the silylating agent through the top plate and into the reaction chamber. A porous ceramic material has been used as the top plate which has provided another slight improvement in uniformity. However, a systematic reduction in the line-width caused by weaker silylation still exists in the center of the wafer. It is therefore apparent that a better system is required to improve uniformity of flow of the silylating agent within the reaction chamber, especially in conjunction with photolithographic lines of about 0.6 microns and below.

SUMMARY OF THE INVENTION

In accordance with the present invention, the above noted problem of the prior art is minimized and there is provided a system and method whereby the uniformity of the silylating agent throughout the reaction chamber and primarily at the surface of the wafer is significantly improved to provide a significant improvement in the line width uniformity.

The above is accomplished in accordance with a first embodiment of the invention by stagnant silylation wherein the silylating agent is introduced into the reaction chamber either alone or in conjunction with an inert gas carrier in an amount of from about 0.5 to about 20 standard liters/minute with a preferred amount of 3 standard liters/minute and the reaction chamber is sealed during the entire time required to carry out the silylation. The advantage of this approach is optimum uniformity since once equilibrium has been reached, there is no net change of flow or pressure of the silylating agent across the wafer. Another advantage is reduction in the total consumption of the silylating and carrier gases.

In accordance with a second embodiment of the invention, the silylating agent flows at a flow rate of from about 0.5 to about 10 standard liters/minute with a preferred flow rate of from about 1 to about 3 standard liters/minute laminarly across the surface of the wafer to provide uniformity of the silylating agent at the wafer surface. This is accomplished by introducing the silylating agent and carrier gas along one side of the wafer and uniformly flowing the gases across the entire wafer due to a pressure differential across the wafer from the location(s) of gas entry into the reaction chamber to the location(s) of gas exit from the reaction chamber, for example. The concentration of the silylating agent, preferably HMDS, in the carrier gas is not known or controlled. The HMDS is retained at a temperature of 50° C. At this temperature, the HMDS partial pressure is near 50 Torr. The pressure range is preferrably from about 10 to about 80 Torr with a preferred pressure of 50 Torr.

DESCRIPTION OF THE PREFERRED EMBODIMENT

Figure 1:
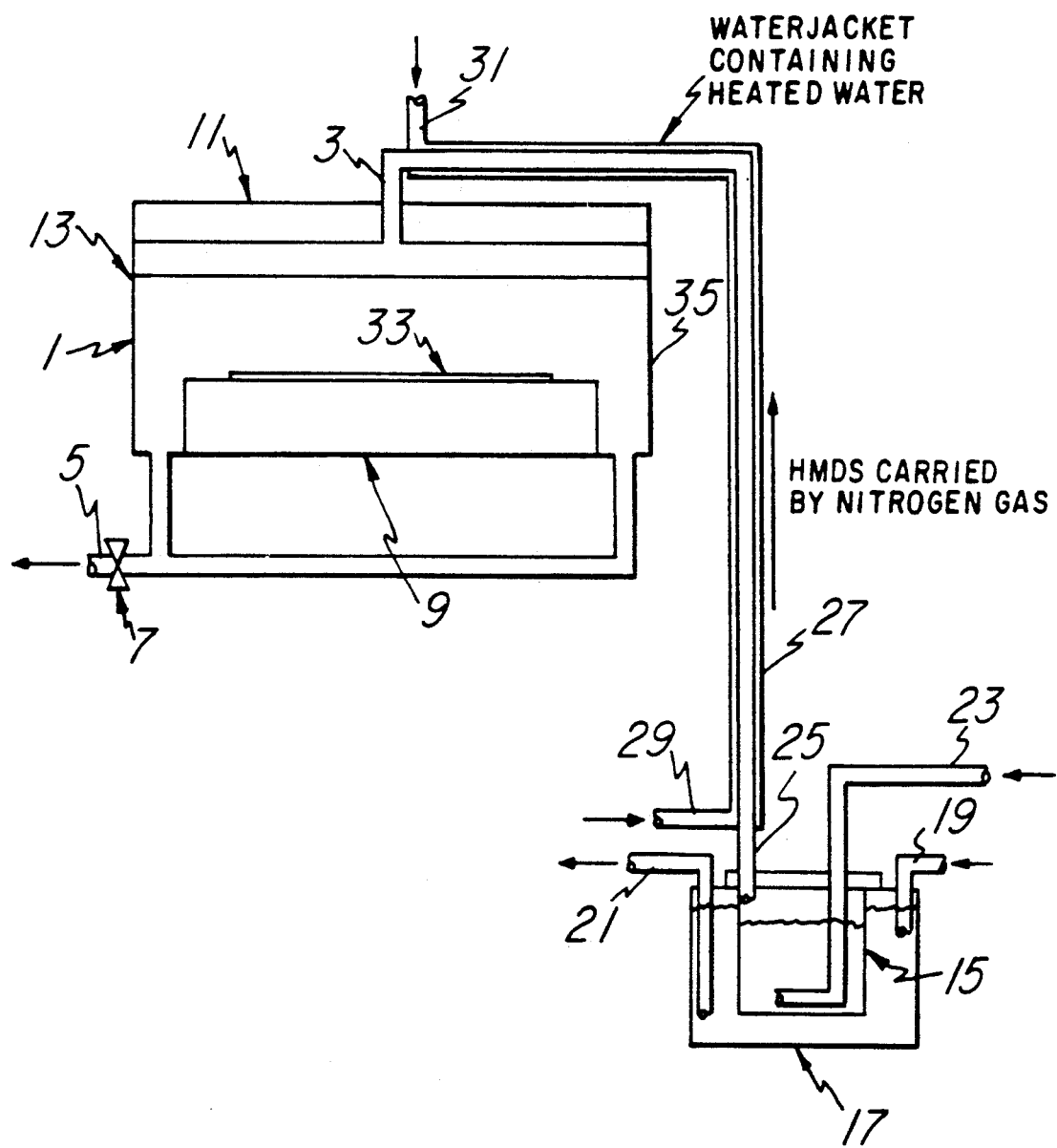
FIG. 1 is a schematic drawing of a silylation system in accordance with a first embodiment of the invention.

Referring to FIG. 1, there is shown a silylation system including a reaction chamber 1 having an inlet 3 and an exhaust 5 having an exhaust valve 7. Within the chamber 1 is a lower hot plate 9 which can be adjusted to a predetermined temperature, an upper hot plate 11 and a top plate 13 for dispersing inlet gases uniformly across the chamber. An enclosed vessel 15 containing HMDS is disposed in a vessel 17 containing heated water to maintain the HMDS at a temperature in the range of from about 20 to about 80° C. and preferably 50°. The vessel 17 includes a circulating hot water inlet 19 and a water outlet 21 to maintain the water temperature therein at the desired level. Nitrogen gas is bubbled through the HMDS via an inlet 23 and becomes saturated with HMDS vapor, the nitrogen with HMDS carried therewith passing from the enclosed vessel 15 to an outlet 25 which extends to the inlet 3 to the reaction chamber 1. The outlet 25 is disposed within a water jacket 27 containing heated water at least at the same temperature as the HMDS vessel to avoid condensation of HMDS vapors from the gas carrier to maintain the HMDS carried by the nitrogen in the gaseous state. The water jacket 27 includes an inlet 29 and an outlet 31.

In operation, a semiconductor wafer 33 having thereon an exposed resist formulated to operate in the present scheme, of the type described above, preferably Plasmask 200 g, is placed on the lower plate 9 and baked by heating at a temperature of from about 158° to about 168° C. and preferably 160° C. for i to 3 minutes and preferably 2 minutes to cause cross-linking of the novolac resin. Nitrogen gas is then passed through the chamber 1 for about 10 seconds to provide a nitrogen flush. At the present time, the wafer remains on the same bottom hot plate. The wafer 33 is then placed on a second lower hot plate 9 (not shown) which is adjusted to the same temperature as the first hot plate, for 4 to 8 minutes and preferably for 4 minutes. The exhaust valve 7 is then closed and nitrogen gas at a back pressure of at least one atmosphere is bubbled through the HMDS and passes into the chamber while carrying HMDS vapor therewith. The nitrogen back pressure is much higher than the chamber pressure. The HMDS reacts with the resist only at the exposed regions thereof to provide a silicon layer thereat. The wafer 33 is then removed from the chamber 1 for oxidation of the silicon and subsequent etching.

The development step takes place in an oxygen plasma at pressures of less than 3 milliTorr. The low pressure is required to achieve high anisotropy. It is desired that the ions collide with the surface of the resist at as close to a ninety degree angle as possible to form a silicon oxide at the silicon locations and gaseous oxides of the components of the resist in the non-silicon regions. The high degree of directionality of the oxygen ions provides improved profiling of the remaining resist and provides the improved integrity and accuracy sought. This also permits developing of a pattern on severe topography and causes reflectivity and topography to be less of a factor as compared with the prior art.

Figure 2:
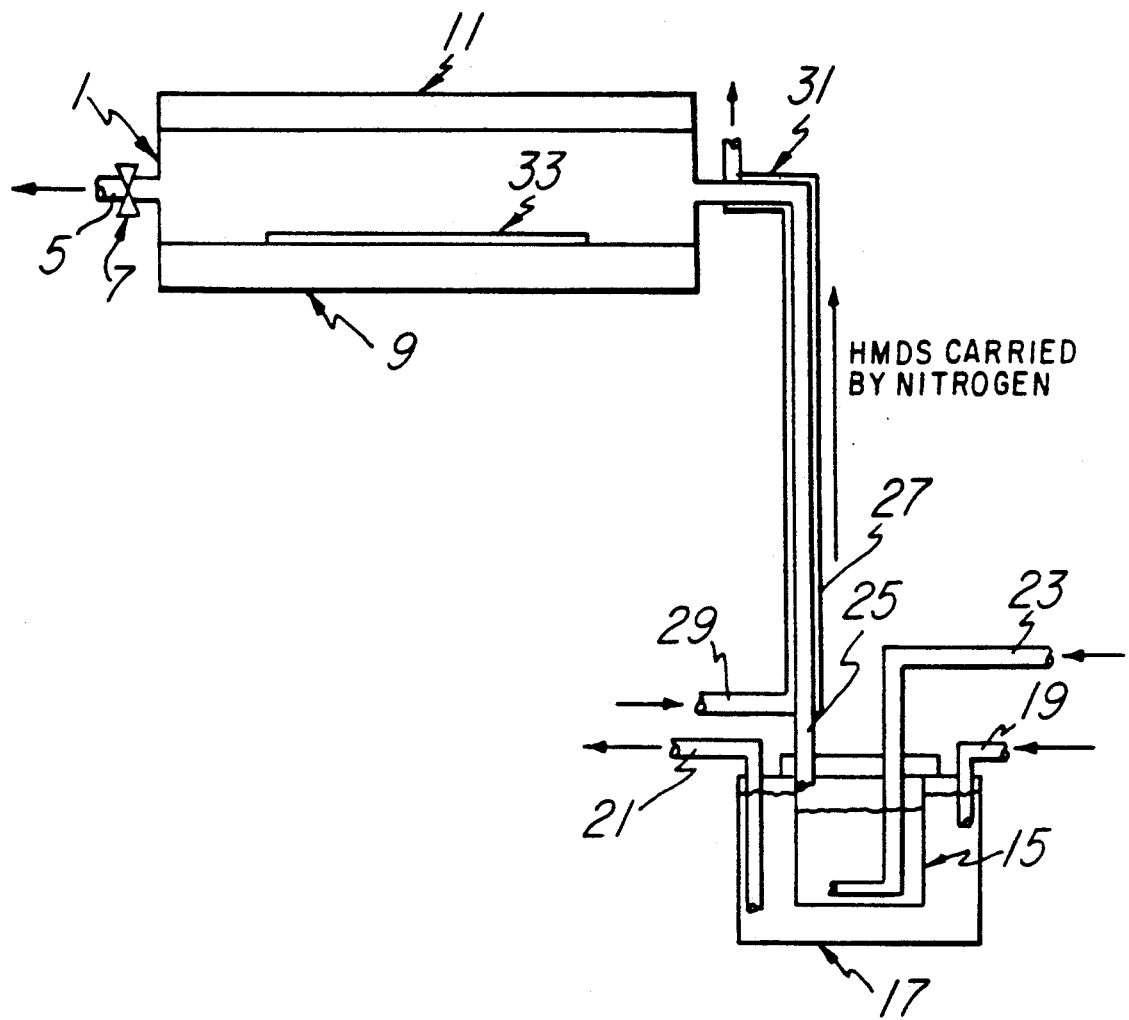
FIG. 2 is a schematic drawing of a silylation system in accordance with a second embodiment of the invention.

In accordance with a second embodiment of the invention, as shown in FIG. 2, the silylating agent flows at a flow rate of from about 0.5 to about 10 standard liters/minute with a preferred flow rate of from about 1 to about 3 standard liters/minute laminarly across the surface of the wafer to provide uniformity of the silylating agent at the wafer surface. This is accomplished by introducing the silylating agent and carrier gas along one side of the wafer and uniformly flowing the gases across the entire wafer due to a pressure differential across the wafer from the location(s) of gas entry into the reaction chamber to the location(s) of gas exit from the reaction chamber, for example. The concentration of the silylating agent, preferably HMDS, in the carrier gas is not known or controlled. The HMDS is retained at a temperature of 50° C. At this temperature, the HMDS partial pressure is near 50 Torr. The pressure range is preferrably from about 10 to about 80 Torr with a preferred pressure of 50 Torr.

Though the invention has been described with respect to specific preferred embodiments thereof, many variations and modifications will immediately become apparent to those skilled in the art. It is therefore the intention that the appended claims be interpreted as broadly as possible in view of the prior art to include all such variations and modifications.

We claim:

1. A method of providing uniform concentration of a silylating agent across the surface of a semiconductor wafer comprising the steps of:
   (a) providing an enclosable chamber having an inlet and an exhaust;
   (b) providing a semiconductor wafer having a resist on said semiconductor wafer having a novolak component containing at least one of hydroxyl and phenyl groups;
   (c) placing said semiconductor wafer in said chamber;
   (d) closing said exhaust;
   (e) passing a carrier gas containing a silylating agent therein through said inlet into said chamber to provide a predetermined state of silylating agent in said chamber; and
   (f) allowing said silylating agent to reside in said chamber for a predetermined period to form regions of silicon at said exposed predetermined portions.

2. The method of claim 1 wherein said carrier gas and silylating agent are substantially uniformly distributed throughout said chamber.

3. A method for passing a silylating agent across the surface of a semiconductor wafer with laminar flow, comprising the steps of:
   (a) providing an enclosable chamber having an inlet along one side wall of said chamber and an exhaust along an opposing side wall of said chamber;
   (b) providing a semiconductor wafer having a resist with exposed portions wherein said resist has a novolak component containing at least one of hydroxyl and phenyl groups;
   (c) placing said semiconductor wafer in said chamber between said inlet and said exhaust;
   (d) passing a carrier gas containing a silylating agent therein from said inlet to said exhaust to provide a predetermined laminar flow of silylating agent across the surface of said semiconductor wafer to form regions of silicon at said exposed predetermined portions.

4. The method of claim 3 wherein said inlet, said exhaust and said wafer are substantially coplanar.

5. The method of claim 3 further including providing a pressure differential between said inlet and said exhaust.

6. The method of claim 4 further including providing a pressure differential between said inlet and said exhaust.

7. A system for providing uniform concentration of a silylating agent across the surface of a semiconductor wafer comprising:
   (a) an enclosable chamber having an inlet and an exhaust;
   (b) a semiconductor wafer having a resist on said semiconductor wafer wherein said resist contains a novolak component containing at least one of hydroxyl and phenyl groups;
   (c) means for closing said exhaust; and
   (d) means for passing a carrier gas containing a silylating agent therein through said inlet into said chamber to provide a predetermined state of silylating agent in said chamber.

8. The system of claim 7 further including means to uniformly distribute said carrier gas and silylating agent throughout said chamber.

9. A system for passing a silylating agent across the surface of a semiconductor wafer with laminar flow, comprising:
   (a) an enclosable chamber having an inlet along one side wall of said chamber and an exhaust along an opposing side wall of said chamber;
   (b) a semiconductor wafer having a resist with exposed portions wherein said resist contains a novolak component containing at least one of hydroxyl and phenyl groups disposed in said chamber between said inlet and said exhaust; and
   (c) means for passing a carrier gas containing a silylating agent therein from said inlet to said exhaust to provide a predetermined laminar flow of silylating agent across the surface of said wafer to form regions of silicon at said exposed predetermined portions.

10. The system of claim 9 wherein said inlet, said exhaust and said wafer are substantially coplanar.

11. The system of claim 9 further including means to provide a pressure differential between said inlet and said exhaust.

12. The system of claim 10 further including means to provide a pressure differential between said inlet and said exhaust.

13. The method of claim 1 wherein said silylating agent is HMDS.

14. The method of claim 3 wherein said silylating agent is HMDS.

15. The method of claim 5 wherein said silylating agent is HMDS.

16. The method of claim 6 wherein said silylating agent is HMDS.

17. The system of claim 7 wherein said silylating agent is HMDS.

18. The system of claim 9 wherein said silylating agent is HMDS.

19. The system of claim 11 wherein said silylating agent is HMDS.

20. The system of claim 12 wherein said silylating agent is HMDS.

* * * * *